US008174280B2

(12) United States Patent
Hung

(10) Patent No.: US 8,174,280 B2

(45) Date of Patent: May 8, 2012

(54) METHOD OF TESTING DISPLAY PANEL

(75) Inventor: Hung-Chung Hung, Taichung County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 154 days.

(21) Appl. No.: 12/477,902

(22) Filed: Jun. 3, 2009

(65) Prior Publication Data

US 2010/0171507 A1 Jul. 8, 2010

(30) Foreign Application Priority Data

Jan. 5, 2009 (TW) ............................... 98100100 A

(51) Int. Cl.
*G01R 31/26* (2006.01)
*G01R 31/02* (2006.01)

(52) U.S. Cl. ............... 324/760.01; 324/760.02; 324/537

(58) Field of Classification Search ............. 324/760.01, 324/760.02, 537
See application file for complete search history.

(56) References Cited

U.S. PATENT DOCUMENTS

| | | | | |
|---|---|---|---|---|
| 6,781,403 | B2 * | 8/2004 | Kim | 324/750.3 |
| 7,298,164 | B2 * | 11/2007 | Chen et al. | 324/760.01 |
| 7,336,093 | B2 * | 2/2008 | Uei et al. | 324/760.01 |
| 2002/0051114 | A1 * | 5/2002 | Kwak et al. | 349/192 |
| 2006/0186913 | A1 * | 8/2006 | Kim | 324/770 |
| 2007/0279409 | A1 * | 12/2007 | Choi | 345/214 |
| 2008/0061815 | A1 * | 3/2008 | Chen et al. | 324/770 |
| 2008/0074137 | A1 * | 3/2008 | Kim et al. | 324/770 |
| 2009/0104074 | A1 * | 4/2009 | Bodlaender et al. | 422/50 |
| 2009/0294771 | A1 * | 12/2009 | Kim et al. | 257/59 |
| 2010/0066383 | A1 * | 3/2010 | Chung et al. | 324/512 |
| 2010/0141293 | A1 * | 6/2010 | Chen et al. | 324/770 |
| 2010/0157191 | A1 * | 6/2010 | Jeoung et al. | 349/54 |

FOREIGN PATENT DOCUMENTS

| | | |
|---|---|---|
| TW | 200630672 | 9/2006 |
| TW | 200807078 | 2/2008 |
| TW | 200819824 | 5/2008 |

* cited by examiner

*Primary Examiner* — Amy He

(74) *Attorney, Agent, or Firm* — Winston Hsu; Scott Margo

(57) ABSTRACT

A method of testing the display panel is provided. a display panel is provided, wherein the display panel has shorting bars and testing pads in a first peripheral area, and IC pads in a second peripheral area. A first stage test is performed to input a common voltage signal and a plurality of first stage test signals to the testing pads. A switching step is implemented to stop inputting the first stage test signals. A second stage test is carried out to input at least a second stage test signal to the IC pads.

11 Claims, 4 Drawing Sheets

METHOD OF TESTING DISPLAY PANEL

BACKGROUND OF THE INVENTION

1. Field of the Invention

The present invention is related to a method of testing a display panel, and more particularly, to a two stage testing method with a protection function.

2. Description of the Prior Art

In contrast to conventional non-flat display device, such as cathode ray tube (CRT) display device, flat display device has gradually become the main product in consumer electronic product market for its characteristics of lighter in weight, thinner in thickness, etc. Based on different displaying techniques, the flat display device includes plasma display (PD), liquid crystal display (LCD), organic light-emitting diode (OLED) display and so forth. In order to maintain the quality of the products, all of the aforementioned display devices must undergo quality test in the fabricating process, so as to exclude defect products.

In the conventional method of testing a display panel, a plurality of shorting bars are disposed on the terminal opposite to the IC terminal (terminal-side). In other words, the shorting bars are disposed on the opposite-terminal-side. Thus, only the defects occur to the opposite-terminal-side can be detected via the conventional method of testing a display panel. It remains unidentified whether or not defects occur in the IC terminal.

SUMMARY OF THE INVENTION

It is therefore one of the objectives of the present invention to provide a method of testing a display panel to determine if the IC terminal is normal.

To achieve the above-mentioned goal, a method of testing a display panel is provided. The method of testing a display panel includes:

- providing a display panel having at least a shorting bar and a plurality of testing pads in a first peripheral area, and a plurality of IC pads in a second peripheral area that is different from the first peripheral area, wherein the testing pads and the shorting bar are electrically connected;
- performing a first stage test including inputting a common voltage signal and a plurality of first stage test signals to the testing pads to test the display panel;
- performing a switching step to stop inputting the first stage test signals, and inputting the common voltage signal continuously to the testing pads; and
- performing a second stage test, including inputting at least a second stage test signal to the IC pads.

To achieve the above-mentioned goal, a method of testing a display panel is provided. The method of testing a display panel includes:

- providing a testing apparatus having a protection device, a first stage test signal source, and a second stage test signal source;
- providing a display panel comprising at least a shorting bar and a plurality of testing pads in a first peripheral area, and a plurality of IC pads in a second peripheral area that is different from the first peripheral area, wherein the testing pads and the shorting bar are electrically connected;
- performing a first stage test including inputting a common voltage signal and a plurality of first stage test signals to the testing pads from the first stage test signal source to test the display panel;

- performing a switching step to stop inputting the first stage test signals via the protection device, and inputting the common voltage signal continuously to the testing pads; and
- performing a second stage test including inputting at least a second stage test signal from the second stage test signal source to the IC pads.

The method of testing a display panel in the present invention is capable of determining the quality of two different terminals, and is competent to isolate the transferring signals of the first stage test from that of the second stage test. As a result, the problem of signal source break down caused by inappropriate/incomplete separation of both the signals of the first stage test and the second stage test during the switching step may be avoided.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and the following claims in the present invention to refer to particular elements. As one skilled in the art will appreciate, electronic equipment manufacturers may refer to a very same element with different names. The description and the following claims in the present invention intend to distinguish between elements that differ in function but not in name. In the following description and the claims, the terms "include", "have" and "comprise" are used in an open-ended fashion, and thus should be interpreted to mean "include, but not limited to . . . ." Also, the term "electrically connect" is intended to mean either a direct or an indirect electrical connection. Accordingly, if one device is electrically connected to another device, the electrical connection may be through a direct electrical connection, or through an indirect electrical connection via other devices and connections.

Figure 1:
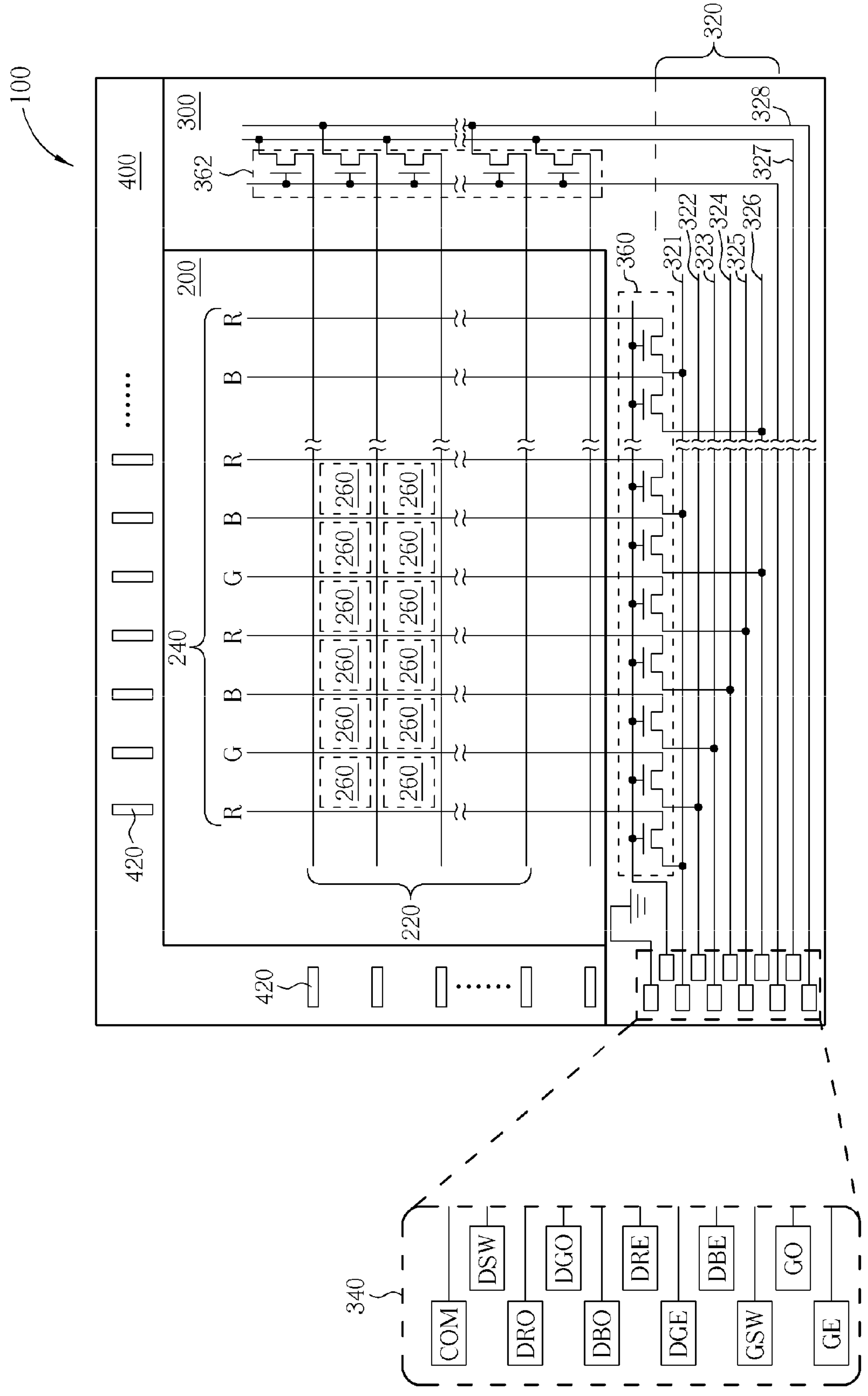
FIG. 1 is a schematic view of a display panel provided in the present invention.

Please refer to FIG. 1. FIG. 1 is a schematic view of a display panel in a preferred embodiment of the present invention. A display panel 100 includes a display region 200, a first peripheral area 300 and a second peripheral area 400. In the display region 200, the display panel 100 includes a plurality of gate lines 220, a plurality of data lines 240, and a plurality of pixels 260 defined by any two adjacent gate lines 220 and any two adjacent data lines 240. Each of the pixels 260 further includes at least a thin film transistor (TFT) (not shown) to drive the corresponding pixel 260, and detail is not redundantly described as it is well known to one skilled in the art. The display panel 100 includes at least a shorting bar 320 and a plurality of testing pads 340 electrically connected to the shorting bar 320 in the first peripheral area 300, and a plurality of IC pads 420 in the second peripheral area 400. One end (terminal) of each of the gate lines 220 is electrically connected to the corresponding IC pads 420, while the other end of each of the gate lines 220 is electrically connected to the corresponding testing pads 340. Similarly, one end of each of the data lines 240 is electrically connected to the corresponding IC pads 420, while the other end of each of the data lines 240 is electrically connected to the corresponding testing pads 340. In the preferred embodiment of the present invention, the first peripheral area 300 is defined as the opposite side of the IC terminal, i.e. the signal of controlling the display panel 100 is not input via this side. The second peripheral area 400, on the other hand, is the IC terminal. In other words, the signal of controlling the display panel 100 is input via this side. The above mentioned definition of the first and the second peripheral areas 300, 400 is not limited. For instance, the relative location of the first peripheral area 300 and the second peripheral area 400 may be mutually exchanged. It should be noted that the testing pads 340 and the IC pads 420 are located on the two opposite sides of the display panel 100, and the signal of controlling the display panel 100 is input via the IC pads 420.

In the preferred embodiment, in addition to separating the data lines into odd numbered data lines and even numbered data lines, the data lines for red (R), green (G), blue (B) signals are also separated. A 6D2G (i.e. six data lines and two gate lines) signal test is carried out, but not limited. The signal test may be 2D2G (i.e. two data lines and two gate lines), 3D2G (i.e. three data lines and two gate lines) or other combinations of signals as signal source for testing a display panel. The shorting bars 320 in the preferred embodiment of the present invention may be numbered sequentially from a first shorting bar 321 to an eighth shorting bar 328, and the testing pads 340 may be separated into testing pads DRO, DGO, DBO, DRE, DGE, DBE, GO, GE and COM, wherein the first shorting bar 321 is electrically connected between the odd numbered red data lines and the testing pad DRO; the second shorting bar 322 is electrically connected between the odd numbered green data lines and the testing pad DGO; the third shorting bar 323 is electrically connected between the odd numbered blue data lines and the testing pad DBO; the forth shorting bar 324 is electrically connected between the even numbered red data lines and the testing pad DRE; the fifth shorting bar 325 is electrically connected between the even numbered green data lines and the testing pad DGE; the sixth shorting bar 326 is electrically connected between the even numbered blue data lines and the testing pad DBE; the seventh shorting bar 327 is electrically connected between the odd numbered gate lines and the testing pad GO; the eighth shorting bar 328 is electrically connected between the even numbered gate lines and the testing pad GE; and the testing pad COM is electrically connected to the display panel 100. The shorting bars 320 are electrically connected to the gate lines 220 and data lines 240 via a switching circuit. The switching circuit includes a first switch 360 and a second switch 362, wherein the control terminal of the first switch 360 is electrically connected to the testing pad DSW and the control terminal of the second switch 362 is electrically connected to the testing pad GSW. The switching circuit is turned on only when performing testing of the panel.

The method of testing the display panel in the preferred embodiment of the present invention includes two stages of test, including a first stage test $T_I$ and a second stage test $T_{II}$. The testing signals are transferred via the testing pads 340 to the gate lines 220 and the data lines 240 during the first stage test $T_I$. However, the testing signals during the second stage test $T_{II}$ are transferred via the IC pads 420 to the gate lines 220 and the data lines 240. In other words, the test signals of the two stages of test are input via the opposite direction to the display panel 100. In this case, the testing signals transmitted from the IC terminal in the second stage test may reach the testing pads and meet the source of the testing signals of the first stage during the transition, resulting in burning down of the other source of testing signals, and vice versa. Therefore, the method of testing the display panel in the preferred embodiment of the present invention isolates the test signals in the two different stages of test via the establishment of the protection device. The facilities of the protection device (a testing apparatus) and the functioning methods of the facilities are illustrated in details in the following paragraph.

Figure 2B:
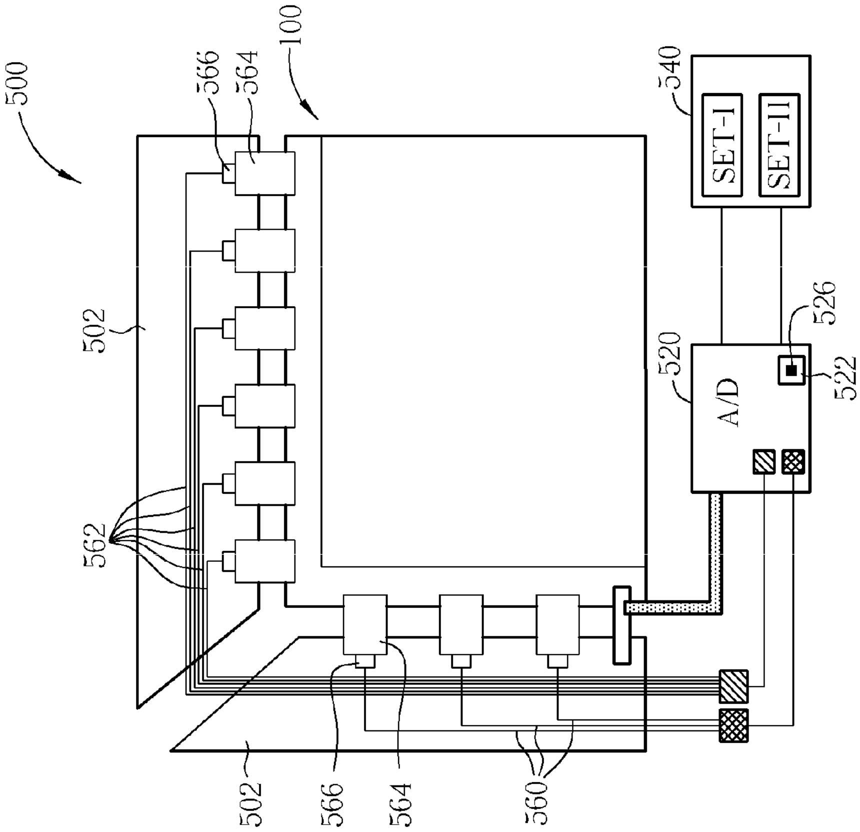
FIG. 2 is the top view illustrating the interaction between the display panel in FIG. 1 and a testing apparatus.
Figure 2A:
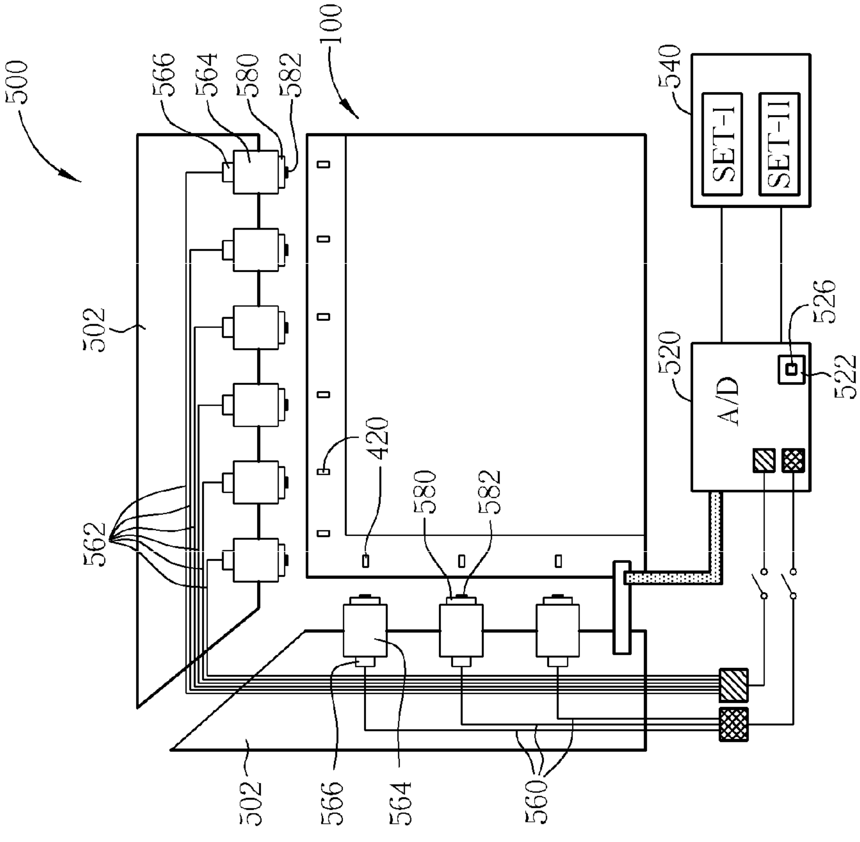
Figure 3A:
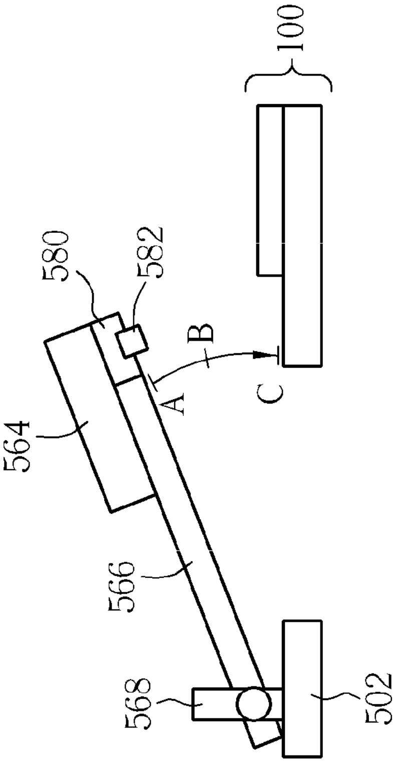
FIG. 3 is a cross-sectional view illustrating the interaction between the display panel and a testing apparatus of FIG. 2.
Figure 3B:
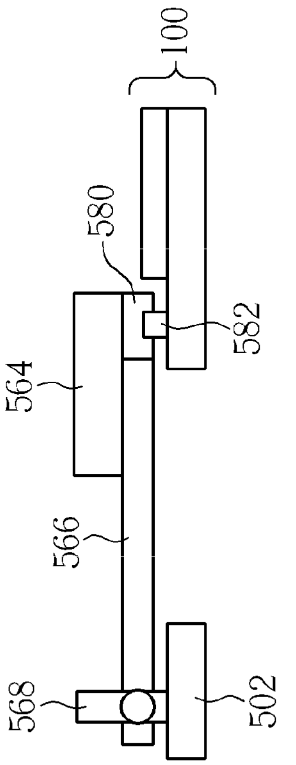

Please refer to FIG. 2 and FIG. 3. FIG. 2 and FIG. 3 are schematic diagrams illustrating the interaction between the display panel in FIG. 1 and a testing apparatus. FIG. 2*a* and FIG. 3*a* are top view and cross-sectional view illustrating the interaction between the display panel and a testing apparatus during the first stage test, respectively. FIG. 2*b* and FIG. 3*b* are top view and cross-sectional view illustrating the interaction between the display panel and a testing apparatus during the second stage test, respectively. As shown in FIG. 2*a* and FIG. 3*a*, the display panel 100 is disposed on a testing apparatus 500. The testing apparatus 500 includes a testing apparatus base 502, a mobile arm 566, a stand 568 which connects the testing apparatus base 502 to the mobile arm 566, a block 564 disposed on and partially protruded out of the mobile arm 566, a protection device 520, a signal source 540, a first circuit 560 and a second circuit 562. The protection device 520 may be a program design, for example a protection program system. Or, the protection device 520 may further include a precautious device 522. The precautious device 522 may be a precautious light 526 which utilizes different light signs, for instance red lights and green lights, to distinguish the time to transmit the right signals for the two stages, but is not limited. The signal source 540 further includes a first stage test signal source $S_{SET\text{-}I}$ and a second stage test signal $S_{SET\text{-}II}$ in the preferred embodiment of the present invention, but is not limited. The structure of the testing apparatus 500 is detailed in FIG. 3*a*, a buffer pad 580 is further disposed beneath the portion of the block 564 which is protruded out of the mobile arm 566 is. A conductive paste 582 is disposed below the buffer pad 580, and at least a conductive wire (not shown) is interposed between the buffer pad 580 and the conductive paste 582. The first circuit 560 may transmit the signals from the second stage test signal $S_{SET\text{-}II}$ of the signal source 540 under the control of the protection device 520 and transmit test signals via the mobile arm 566 to each of the IC pads 420 that is electrically connected to the corresponding gate lines 220; while the second circuit 562 may transmit the signals from the second stage test signal $S_{SET\text{-}II}$ of the signal source 540 under the control of the protection device 520 and transmit test signals via the mobile arm 566 to each of the IC pads 420 that is electrically connected to the corresponding data lines 240 so as to test the display panel 100.

The method of testing a display panel in the preferred embodiment of the present invention includes two stages. First, a first stage test $T_I$ is performed, a switching step $T_S$ is performed subsequently, and a second stage test $T_{II}$ is finally carried out to test the display panel 100. The first stage test $T_I$ may be for example a shorting bar test, but not limited. The second stage test $T_{II}$ may be for example a light on test, but not limited. The action of the mobile arm 566 during the first stage test $T_I$ is shown as FIG. 3*a*. In the meantime, the protection device 520 displays a light sign for the first stage test $T_I$, for example the precautious light 526 in FIG. 2*a* displays green light. The mobile arm 566 is not electrically connected to the display panel 100 via the conductive paste 582 during the first stage test $T_I$, a combination of a common voltage signal $V_{com}$ and a plurality of first stage test signals $S_I$ may be transmitted from the first stage test signal source $S_{SET-I}$ of the signal source 540 to the testing pads COM, DRO, DGO, DBO, DRE, DGE, DBE, GO, GE, DSW and GSW for testing the display panel 100. The first stage test signals $S_I$ includes six data line signals, two gate line signals and two shorting bar switch signals, each transmitting data line signals to testing pads DRO, DGO, DBO, DRE, DGE and DBE, transmitting gate line signals to testing pads GO, GE, and transmitting shorting bar switch signals to testing pads DSW and GSW.

A switching step $T_S$ is performed after completing the first stage test $T_I$. Since the mobile arm 566 is movable, it is designed to follow a route during the switching step $T_S$. The route is illustrated in FIG. 3*a* as a curve starting from point A, passing by point B and reaching point C. After the switching step Ts completes, the relative position of the display panel and the testing apparatus is as illustrated in FIG. 3*b*. The light sign shown by the protection device 520 changes into a light sign for the second stage test $T_{II}$, for example the precautious light 526 in FIG. 2*a* displays red light. The mobile arm 566 is electrically connected to the IC pads 420 of the display panel 100 via the conductive paste 582 during the second stage test $T_{II}$, and the first stage test signals $S_I$ transmitted to the testing pads DRO, DGO, DBO, DRE, DGE, DBE, GO, GE, DSW and GSW for testing the display panel 100 are terminated by the protection device 520. It is to be noted that the common voltage signal $V_{com}$ is continuously transmitted to the testing pad COM to facilitate the progress of the follow up second stage test $T_{II}$.

Finally, a second stage test $T_{II}$ is conducted, and the position of the mobile arm 566 is as shown in FIG. 3*b*. As previously mentioned, the mobile arm 566 is electrically connected to the IC pads 420 of the display panel 100 via the conductive paste 582 during the second stage test $T_{II}$, and the first stage test signals $S_I$ for testing the display panel 100 are terminated by the protection device 520 while the common voltage signal $V_{com}$ is continuously transmitted to the testing pad COM. The testing signal is switched into the second stage test signals $S_{II}$ transmitted from the second stage test signal source $S_{SET-II}$ of the signal source 540 during the second stage test $T_{II}$. The second stage test signals $S_{II}$ are transmitted via the protection device 520, to the first circuit 560 and/or the second circuit 562, the mobile arm 566, the conductive wire (not shown) in between the buffer pad 580 and the conductive paste 582 beneath the block 564, and finally to the gate lines 220 and the data lines 240 of the display panel 100 via the IC pads 420. Accordingly, the IC pads 420 are therefore tested to confirm whether they are normal or abnormal. The second stage test signals $S_{II}$ includes at least a data line signal and at least a gate line signal.

The protection device 520 in the preferred embodiment of the present invention mainly utilizes the precautious device 522, for example a precautious light 526 or other device to display the different light signs. The light sign for the first stage test $T_I$, such as a green light is displayed while the mobile arm 566 locates in between the points A and B. In addition, when the mobile arm 566 is located in between the points B and C, a red light is displayed by the precautious light 526. The timing of transmitting the test signals of the two different stages from the signal source 540 is discriminated by the displayed light sign, which relates to the different location of the mobile arm 566 along the route. In other words, controlling the precise switching of the test signals transmission from the first stage test signal source $S_{SET-I}$ and the second stage test signal source $S_{SET-II}$ comprised in the signal source 540 to avoid the problem of burning the signal source caused by transmitting the test signals of both two stages at the same time.

Figure 4:
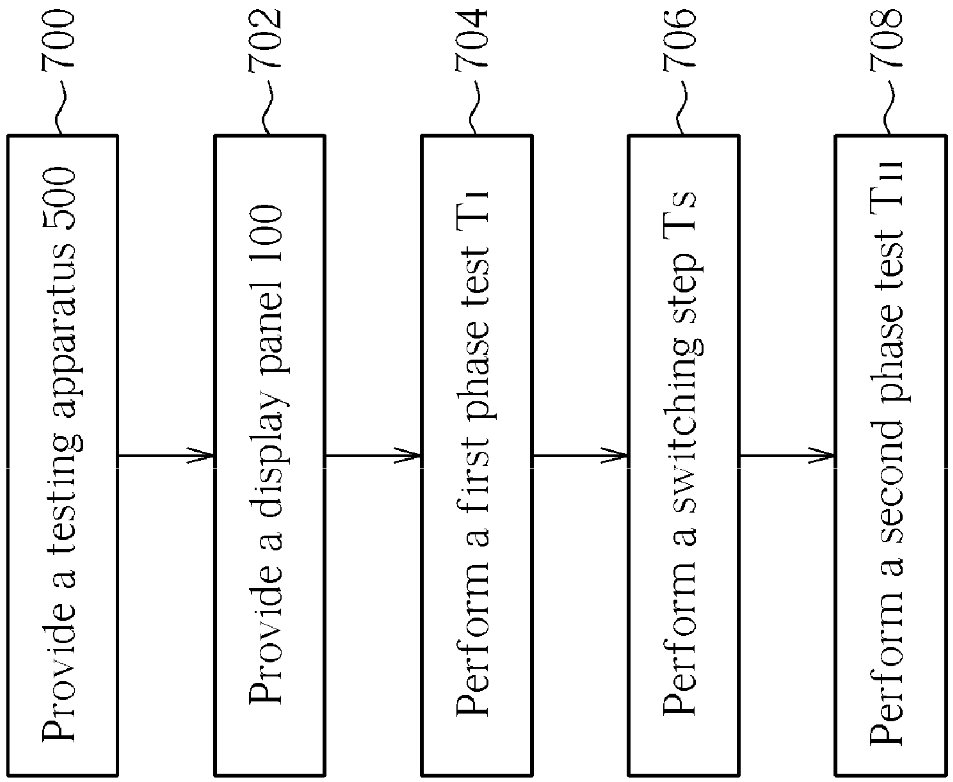
FIG. 4 is a flow chart showing the method of testing a display panel in the present invention.

Please refer to FIG. 4, and also refer to FIG. 2 to FIG. 3. FIG. 4 is a flow chart showing the method of testing a display panel in the present invention. The testing apparatus 500 in the preferred embodiment of the present invention may perform the method of testing a display panel, the steps are as follows:

Step 700: Provide a testing apparatus 500, wherein the testing apparatus 500 includes a protection device 520, a first stage test signal source $S_{SET-I}$, and a second stage test signal source $S_{SET-II}$;

Step 702: Provide a display panel 100. The display panel 100 includes at least a shorting bar 320 and a plurality of testing pads 340 (including DRO, DGO, DBO, DRE, DGE, DBE, GO, GE, COM) locating in a first peripheral area 300, and a plurality of IC pads 420 locating in a second peripheral area 400 that is different from the first peripheral area 300. The testing pads 340 (DRO, DGO, DBO, DRE, DGE, DBE, GO, GE, COM) are electrically connected to the shorting bar 320;

Step 704: Perform a first stage test $T_I$. The first stage test $T_I$ includes inputting a common voltage signal $V_{com}$ to the testing pad COM, and inputting a plurality of first stage test signals $S_I$ to the testing pads DRO, DGO, DBO, DRE, DGE, DBE, GO, GE, to test the display panel 100;

Step 706: Perform a switching step $T_S$. The first stage test signals $S_I$ are terminated by the protection device 520, while the common voltage signal $V_{com}$ is continuously transmitted to the testing pad COM; and Step 708: Perform a second stage test $T_{II}$. The second stage test $T_I$, includes inputting at least a second stage test signals $S_{II}$ to the IC pads 420 by the second stage test signal source $S_{SET-II}$.

The method of testing a display panel in the present invention is capable of detecting both of the two different terminals. In this case, it prevents the uncertainty of whether or not all the defects in the circuit of the display panel are detected caused by merely testing one terminal. Also, due to the protection device or the establishment of the protection program system, the transferring signals of the first stage test from that of the second stage test is isolated. As a result, the problem of burning the signal source caused by inappropriate/incomplete separation of both the signals of the first stage test and the second stage test during the switching step may be avoided.

Those skilled in the art will readily observe that numerous modifications and alterations of the device and method may be made while retaining the teachings of the invention.

What is claimed is:

1. A method of testing a display panel, comprising:

providing a display panel comprising:

at least a shorting bar and a plurality of testing pads disposed in a first peripheral area;

a plurality of IC pads disposed in a second peripheral area that is different from the first peripheral area, wherein the testing pads and the shorting bar are electrically connected;

a plurality of gate lines, wherein a terminal of each of the gate lines is electrically connected to a portion of the IC pads and the other terminal of each of the gate lines is electrically connected to the testing pads;

a plurality of data lines, wherein a terminal of each of the data lines is electrically connected to a portion of the IC pads and the other terminal of each of the data lines is electrically connected to the testing pads; and a plurality of pixels disposed in a display region, wherein part of the pixels are electrically connected between the two terminals of each of the gate lines, and electrically connected between the two terminals of each of the data lines;

performing a first stage test, comprising inputting a common voltage signal and a plurality of first stage test signals to the testing pads to test the display panel;

performing a switching step to stop inputting the first stage test signals, and inputting the common voltage signal continuously to the testing pads; and performing a second stage test, comprising inputting at least a second stage test signal to the IC pads.

2. The method of claim 1, further comprising providing a precautious notice after accomplishing the first stage test, and stopping inputting the first stage test signals according to the precautious notice while continuing providing the common voltage signal to the testing pads.

3. The method of claim 1, wherein the first stage test signals comprise at least a data line signal, at least a gate line signal, and at least a shorting bar switch signal.

4. The method of claim 1, wherein the second stage test signals comprise at least a data line signal and at least a gate line signal.

5. The method of claim 1, wherein the second stage test comprises performing a light on test upon the display panel to test the display panel.

6. A method of testing a display panel, comprising:

providing a testing apparatus comprising a protection device, a first stage test signal source, and a second stage test signal source;

providing a display panel comprising:

at least a shorting bar and a plurality of testing pads disposed in a first peripheral area;

a plurality of IC pads disposed in a second peripheral area that is different from the first peripheral area, wherein the testing pads and the shorting bar are electrically connected;

a plurality of gate lines, wherein a terminal of each of the gate lines is electrically connected to a portion of the IC pads and the other terminal of each of the gate lines is electrically connected to the testing pads;

a plurality of data lines, wherein a terminal of each of the data lines is electrically connected to a portion of the IC pads and the other terminal of each of the data lines is electrically connected to the testing pads; and a plurality of pixels disposed in a display region, wherein part of the pixels are electrically connected between the two terminals of each of the gate lines, and electrically connected between the two terminals of each of the data lines;

performing a first stage test comprising inputting a common voltage signal and a plurality of first stage test signals to the testing pads from the first stage test signal source to test the display panel;

performing a switching step to stop inputting the first stage test signals via the protection device, and inputting the common voltage signal continuously to the testing pads; and performing a second stage test comprising inputting at least a second stage test signal from the second stage test signal source to the IC pads.

7. The method of claim 6, wherein the testing apparatus further comprises a precautious device which provides a precautious notice after accomplishing the first stage test, and the method further comprises stopping inputting the first stage test signals according to the precautious notice while continuing providing the common voltage signal to the testing pads.

8. The method of claim 7, wherein the precautious device comprises a precautious light.

9. The method of claim 6, wherein the first stage test signals comprise at least a data line signal, at least a gate line signal, and at least a shorting bar switch signal.

10. The method of claim 6, wherein the second stage test signals comprise at least a data line signal and at least a gate line signal.

11. The method of claim 6, wherein the second stage test comprises performing a light on test upon the display panel to test the display panel.

* * * * *